United States Patent [19]

Hirai

[11] 4,008,446
[45] Feb. 15, 1977

[54] MICROWAVE OSCILLATION DEVICE WHOSE OSCILLATION FREQUENCY IS CONTROLLED AT THE RESONANCE FREQUENCY OF A DIELECTRIC RESONATOR

[75] Inventor: Kenji Hirai, Yokohama, Japan

[73] Assignee: Tokyo Shibaura Electric Co., Ltd., Kawasaki, Japan

[22] Filed: July 30, 1975

[21] Appl. No.: 600,527

[30] Foreign Application Priority Data

Aug. 1, 1974   Japan ............................ 49-87513

[52] U.S. Cl. ................................. 331/96; 331/101; 331/107 R; 331/107 G
[51] Int. Cl.$^2$ ......................................... H03B 9/12
[58] Field of Search ................. 331/96, 101, 107 R, 331/107 G, 107 T

[56] References Cited

UNITED STATES PATENTS

| | | | |
|---|---|---|---|
| 3,792,375 | 2/1974 | Brackett | 331/96 |
| 3,866,144 | 2/1975 | Sawayama et al. | 331/107 G |
| 3,883,824 | 5/1975 | Weiner | 331/107 G |

*Primary Examiner*—Siegfried H. Grimm
*Attorney, Agent, or Firm*—Oblon, Fisher, Spivak, McClelland & Maier

[57] ABSTRACT

A microwave oscillation device of the invention comprises a cut-off waveguide having a cut-off characteristic with respect to a frequency used. At one end of this cut-off waveguide is provided a coaxial line member, at one end of which is provided a microwave absorber and at the other end of which is disposed an oscillation element. Within said cut-off waveguide is disposed a dielectric resonator so as to be electromagnetically coupled to the oscillation element of the coaxial line member in terms of lumped constant and to an output waveguide provided at the other end of the cut-off waveguide in terms of distributed constant.

14 Claims, 8 Drawing Figures

MICROWAVE OSCILLATION DEVICE WHOSE OSCILLATION FREQUENCY IS CONTROLLED AT THE RESONANCE FREQUENCY OF A DIELECTRIC RESONATOR

This invention relates to a microwave oscillation device, and more particularly to a microwave oscillation device whose oscillation frequency is controlled at the resonance frequency of a dielectric resonator.

A microwave oscillation device whose oscillation frequency is controlled using a dielectric resonator is disclosed in U.S. Pat. No. 3,866,144 "Microwave Oscillator" filed on Nov. 5, 1973 and patented on Feb. 11, 1975. Conventionally, the microwave oscillation device comprises a rectangular waveguide which is short-circuited at one end and opened at the other end for the purpose of being connected to a load and in which an oscillation element is disposed at a position spaced by a prescribed distance from the short-circuited end and a metal-shielding plate is disposed further spaced by $\lambda g/2$ ($\lambda g$: wavelength in waveguide) from this oscillation element. This metal-shielding plate is disposed spaced by a prescribed distance from an E plane of the waveguide and in parallel with said E plane and in contact with H planes of the waveguide and perpendicularly to said H plane, thereby to form in the waveguide two cut-off regions each having a cut-off characteristic with respect to the oscillation frequency. In one cut-off region a dielectric resonance element is disposed to constitute the dielectric resonator. This dielectric resonance element is electromagnetically coupled to an electromagnetic wave propagated through the waveguide by an attenuating wave passing through the dielectric resonator. In the other cut-off region a resistor is provided along a detuned short-circuited plane of the dielectric resonator. Where, in the microwave oscillation device having the foregoing construction, the detuned short-circuited plane is viewed from the oscillation element toward the load, it is substantially opened at the resonance frequency of the dielectric resonator and short-circuited with respect to the detuning frequency. In this short-circuited condition, the resistor appears as a terminating end-resistance of the equivalent circuit of the microwave oscillation device. Let it be now assumed, in such an oscillation device, that the resistance value $r$ of the resistor normalized by the characteristic impedance of the transmission line of the waveguide is selectively determined in the range of $0 < r < 1$. Then, the locus with respect to the frequency, of the load circuit impedance (or admittance) as viewed from the oscillation element can be partially separated into two mutually distinguishable modes — a detuned mode due to a long-line effect and a fundamental resonance mode of the dielectric resonator. A bias voltage is properly applied to the oscillation element, and the oscillation is drawn into the fundamental resonance mode to realize a stable operation.

In the foregoing prior art oscillation device, however, the length of a line between the waveguide-short-circuiting plane and the detuned-short-circuited plane is substantially $\lambda g$, and usually $\lambda g/\lambda \simeq 1.2$ ($\lambda$: space wavelength). There results from this an increase in size of the device.

The object of the invention is to provide a compact microwave oscillation device having a dielectric resonator.

According to the invention, a microwave oscillation device is provided which is miniaturized by providing a coaxial line member at one end of a waveguide having a cut-off characteristic with respect to a frequency used, and disposing an oscillation element and a resistor within the coaxial line member, and disposing a dielectric resonance element in the cut-off region so as to permit it to be electromagnetically coupled to the oscillation element in terms of lumped constant.

This invention can be more fully understood from the following detailed description when taken in conjunction with the accompanying drawing, in which.

Figure 1:
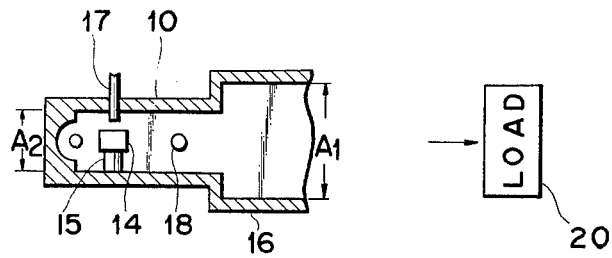
FIG. 1 is a bottom sectional view of a microwave oscillation device according to an embodiment of the invention.
Figure 2:
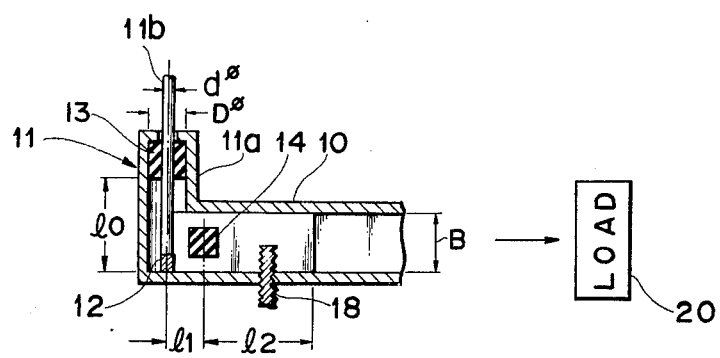
FIG. 2 is a side sectional view of the device of FIG. 1.

In a microwave oscillation device shown in FIGS. 1 and 2 a coaxial line member 11 is provided at one end of a cut-off waveguide 10 (whose inside dimensions are $A_2 \times B$) having a cut-off characteristic with respect to the frequency used. The coaxial line member 11 is composed of a hollow outer conducter 11a communicating with the cut-off waveguide 10 and an inner conductor 11b inserted into the outer conductor in a manner concentrically disposed with the same. The characteristic impedance $Zc$ of the coaxial line member 11 is determined as follows by the inner diameter of D of the outer conductor 11a and the outer diameter d of the inner conductor 11b $$Zc = 138 \log (D/d) \, \Omega.$$

For example, a semiconductor oscillation element 12 such as a Gunn diode or IMPATT diode (Impact Avalanche Transit Time) is connected between one end of the outer conductor 11a at the same level as an H plane of the waveguide 10 and an inserted one end of the inner conductor 11b. Within the other end portion of the outer conductor 11a a microwave absorber as a stabilizing resistor 13 formed of, for example, EPOIRON (trade name) is disposed at a position spaced by the distance of $l_0$ from H plane of the waveguide 10. Within the cut-off waveguide 10 a dielectric resonance element 14 is disposed at a position spaced by the distance of $l_1$ from the oscillation element 12, in a manner supported by a support base 15. To the other end of the cut-off waveguide 10 further spaced by the distance of $l_2$ from this dielectric resonance element 14 is connected an outer waveguide 16 (whose inside dimensions are $A_1 \times B$, provided that $A_1 > A_2$). The support base 15 is formed of, for example, a dielectric material having small dielectric constant and small loss such as REXOLITE (trade name), quartz glass, fluorine compound, or the like, and has to be so constructed as to have no undesirable effect upon the resonance mode and resonance frequency of the dielectric resonance element 14. At a wall portion of the cut-off waveguide 10 facing said dielectric resonance element 14 is inserted therethrough a resonance frequency-fine adjustment rod 17 formed of dielectric or metal material. At a wall portion of the cut-off waveguide 10 spaced by a prescribed distance from the dielectric resonance element 14 toward the output waveguide 16 is screwed therethrough a screw 18 for adjusting the degree of coupling to a load.

When, in the above-mentioned construction, a bias voltage is applied to the semiconductor oscillation element 12 through the inner conductor 11b penetrating through the stabilizing resistor 13, the oscillation element 12 generates a microwave power. Generation of these microwaves causes evanescent fields to be excited around the inner conductor 11b of the coaxial line member 11. By these evanescent fields the dielectric resonance element 14 is electromagnetically coupled, in terms of lumped constant, to the oscillation element 12 and yet is electromagnetically coupled, in terms of distributed constant, to the output waveguide 16, in the neighbourhood of the resonance frequency. These respective degrees of coupling can be determined by the distances $l_1$ and $l_2$ and the insertion of the adjusting screw 18. Further, fine adjustment of the resonance frequency can be performed by adjusting the inserted length of the adjustment rod 17.

The impedance as viewed toward a load 20 from a reference plane of the waveguide 10 including the center axis of the coaxial line member 11 connected to the semiconductor oscillation element 12 is substantially opened at the resonance frequency and substantially short-circuited at the detuned frequency band, so that the resistance value $r$ of the stabilizing resistor 13 normalized by the characteristic impedance $Z_c$ of the coaxial line is selectively determined in the range of $0 < r \leq 1$ and yet a proper adjustment of the distance $l_0$ causes the following to take place to realize a stable operation of the microwave oscillation device. That is to say, by properly adjusting the distance $l_0$ the locus with respect to the frequency, of the load circuit impedance as viewed from the semiconductor oscillation element 12 takes the form in which the fundamental resonance mode of the dielectric resonance element 14 and the detuned mode determined by the distance $l_0$ are partially separated from each other in a series-connected configuration and as a result in the neighbourhood of the operation bias voltage, the oscillation is just drawn into the fundamental resonance mode, thus to realize a stable operation of the device. Where $r = 1$, the distance $l_0$ may be determined such that $l_0 = B$. Although, therefore, the device can be further miniaturized, there is a fear that the operation range in which the oscillation is to be drawn for stabilizing operation becomes slightly narrow. If the axial length of the stabilizing resistor 13 is made sufficiently large, this stabilizing resistor will concurrently act as a microwave absorber for preventing the leak of microwaves into a biasing circuit.

Figure 3:
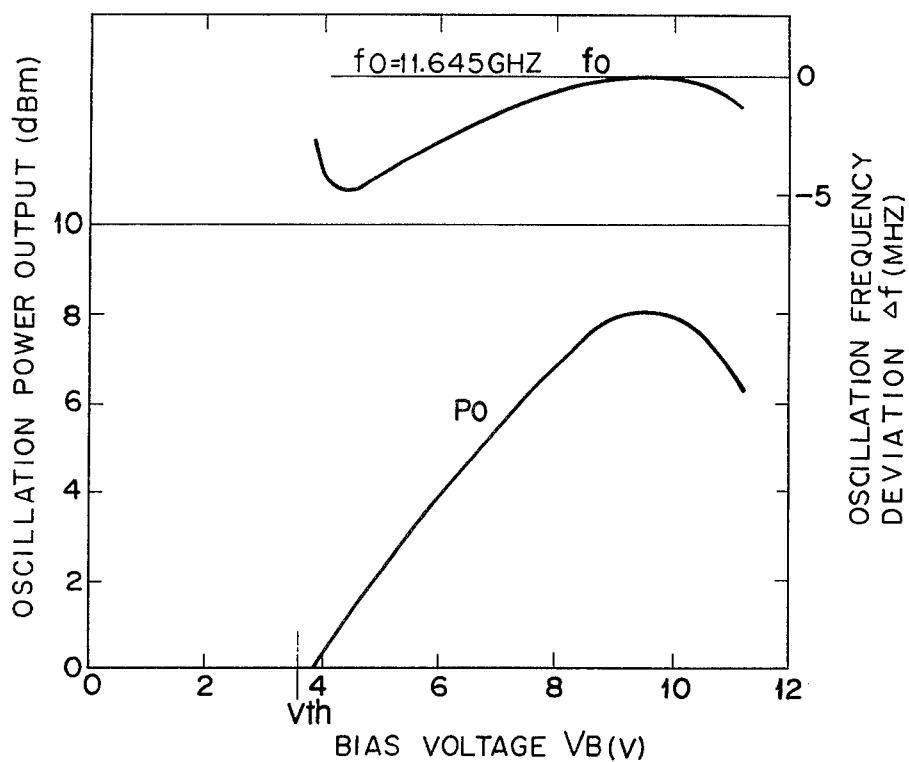
FIGS. 3 and 4 show characteristics of the microwave oscillation device of the invention when it is allowed to oscillate at the X-band frequency.

There will now be described the case where a device in which a Titanate ceramics is used as the dielectric resonance element is used at the X band frequency. In this device, a low power Gunn diode is used as the oscillation element and the resistance value $r$ of the stabilizing resistor is selected in the range of $r \simeq 0.5$. The respective variations of the oscillation output and frequency relative to the variation of bias voltage in this case are shown in FIG. 3. As seen, in this device the oscillation is drawn into a stable operation-region under the conditions wherein:

DC power input $P_{in} \simeq 0.8$ w
Oscillation power output $P_o = 8$ dBm
$\Delta f = 2$ MHz or less/$V_B$ ($V_B = 6.5$ to 11V)
Qext (External Q of the oscillator) $\simeq 6100$
Mode-jumping and hysteresis phenomena were not observed for $V_B \geq 4.0$ V.

Figure 4:
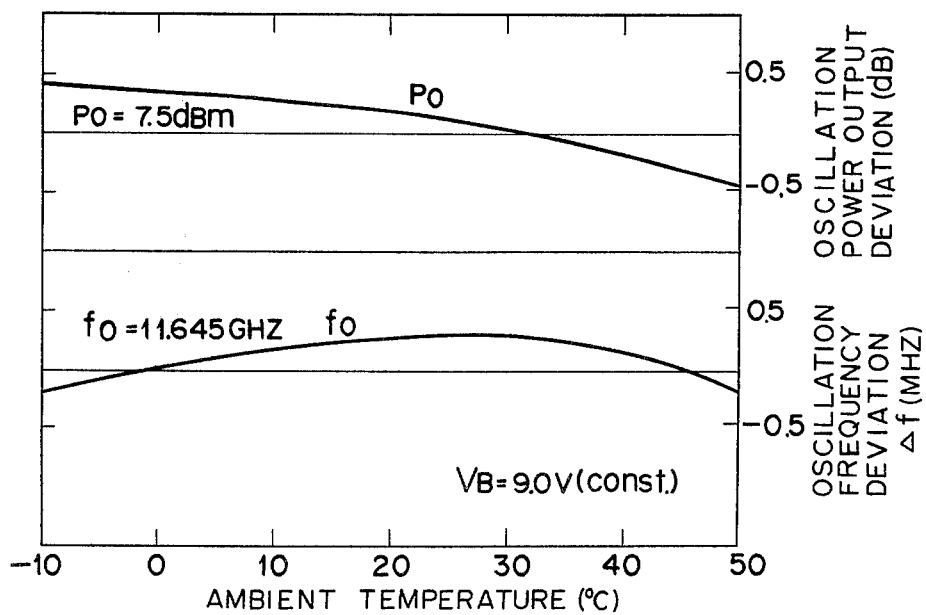

FIG. 4 shows the respective variations of the oscillation power output and frequency relative to the variation of ambient temperature. As seen, $\Delta f \leq 0.5$ MHz ($\Delta f/f_0 \leq 4.3 \times 10^{-5}$) and $|\Delta p/p_0| < 0.5$ dB with respect to the ambient temperature variation from $-10°$ to $50°$ C, and it will be understood, therefore, that an extremely stable oscillation is realized.

Figure 5:
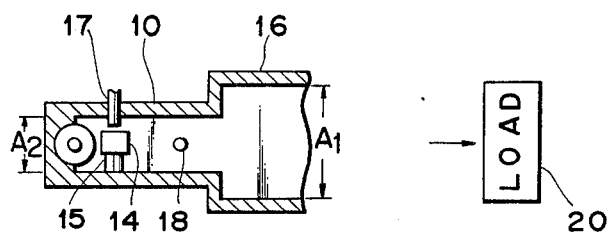
FIG. 5 is a bottom sectional view of the microwave oscillation device according to another embodiment of the invention wherein the oscillation element is disposed at an end portion of the coaxial line member having an end face lower than the H plane of the cut-off waveguide.
Figure 6:
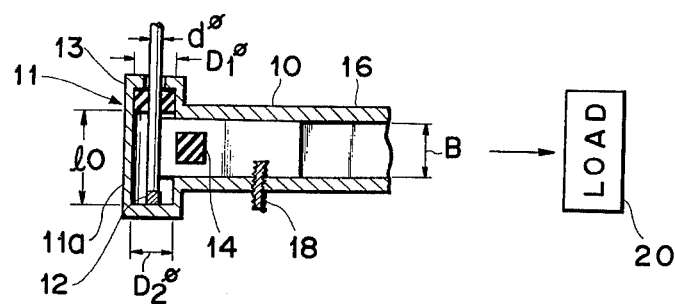
FIG. 6 is a side sectional view of the device of FIG. 5.

Hereinafter, another embodiment is described with reference to FIGS. 5 and 6. The same parts and sections as those of the preceding embodiment are denoted by the same reference numerals. In this embodiment, the coaxial line member 11 is provided at one end of the cut-off waveguide 10 so that one end portion of the coaxial line member 11 having the semiconductor oscillation element 12 disposed thereat may project from the cut-off waveguide 10, that is, so that one inner end face of the outer conductor 11a of the coaxial line member 11 is situated at a level lower than the H plane of the cut-off waveguide 10. The stabilizing resistor 13 is provided at that interior portion of the outer conductor 11a of the coaxial line member 11 which is spaced by the distance of $l_0$ from said one inner end face of the outer conductor 11a at which said semiconductor oscillation element 12 is provided. The inner diameters $D_1$ and $D_2$ at both ends of the outer conductor 11a may not always be equal to each other. Namely, the characteristic impedances of the various portions of the coaxial line member in a longitudinal direction may not always be equal to each other.

Also in the case of this embodiment, by properly adjusting the normalized resistance value r of the stabilizing resistor and the distance $l_0$ the same effect as in the preceding embodiment is obtained, that is, a stable oscillation is realized.

Figure 7:
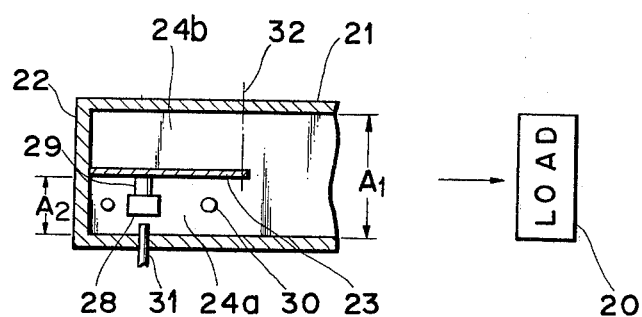
FIG. 7 is a bottom sectional view of the microwave oscillation device according to another embodiment of the invention wherein two cut-off regions are formed by providing a metal-shielding plate within the waveguide.
Figure 8:
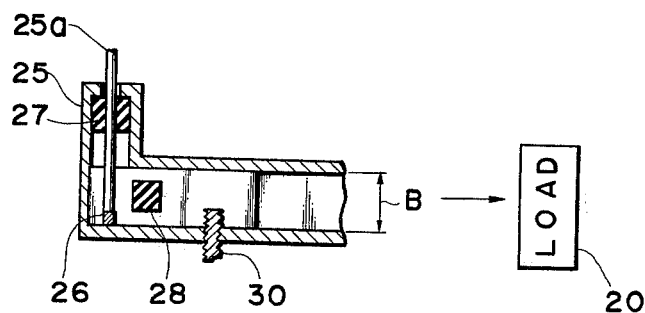
FIG. 8 is a side sectional view of the device of FIG. 7.

Hereinafter, another embodiment is described with reference to FIGS. 7 and 8. In this embodiment, a rectangular waveguide 21 whose inside dimensions are $A_1 \times B$ is short-circuited at one end by a short-circuiting plate 22 and is opened at the other end for the purpose of being electromagnetically coupled to the load 20. Within this waveguide 21 is disposed a metal-shielding plate 23 of a prescribed length in a manner spaced by the distance of $A_2$ ($A_2 < A_1$) from an E plane of the waveguide 21 and in parallel with said E plane and in contact with H planes and perpendicularly to said H plane and in a manner connected at one end to the short-circuiting plate 22. Thus are formed in the waveguide 21 two cut-off regions 24a, 24b each having a cut-off characteristic with respect to the oscillation frequency. In one cut-off region 24a, a coaxial line member 25 is formed at the side of said short-circuiting plate 22. Within both end portions of this coaxial line member 25 are disposed, respectively, a semiconductor oscillation element 26 and a microwave absorber 27 as a stabilizing resistor, and the inner conductor 25a of the coaxial line member 25 is connected to the semiconductor oscillation element 26 in a manner penetrating through the absorber 27. In the cut-off region 24a of the waveguide 21 is disposed a dielectric resonance element 28 in a manner supported by a support base 29. A screw 30 for adjusting the degree of coupling to the load 20 and a resonance frequency fine adjustment rod 31 are respectively provided at respectively prescribed portions of those two walls of the waveguide 21 which partially define said cut-off region 24a.

With the foregoing construction, an evanescent wave advancing toward the short-circuiting plane of the waveguide through the other cut-off region 24b is sufficiently attenuated without reaching said short-circuiting plane, and when viewed from the load 20 toward the short-circuiting plate 22, an equivalent short-circuited plane is situated at a position 32, so that the cut-off region 24b has no undesirable effect upon a stable oscillation. Accordingly, this region 24b can be used similarly to the region 24a and used also for other purposes.

As above described, in the microwave oscillation device according to the invention, the stabilizing resistor and semiconductor oscillation element are provided in the coaxial line member, and the dielectric resonance element disposed within the cut-off waveguide is directly electromagnetically coupled to the evanescent wave excited by electromagnetic field generated due to the oscillation of the semiconductor oscillation element. Thus is obtained a microwave oscillation device which is more compact and inexpensive and permits a more easy circuit adjustment, than the prior art device. As an example, at the X-band frequency the prior art device is of the dimension 38 × 23.5 × 48 mm, whereas the device of the invention is of the dimensions 38 × 23.5 × 21 mm. As seen from this example, the latter device has considerably small outside dimensions as compared with the former device.

The preceding embodiments referred to the case where rectangular waveguides were used as the output waveguide and the cut-off waveguide, but a circular waveguide or a coaxial line member can also be used as the output waveguide and the cut-off waveguide. In the case of using the coaxial line member, its outer and inner conductors have simply to be radially partitioned by conductor plates, in which case this coaxial line member can be regarded as a cut-off waveguide wherein both of such partitioned regions have a cut-off characteristic with respect to the frequency used. Throughout the embodiments, the oscillation element includes a Gunn diode. However, this diode may be replaced by an IMPATT diode, tunnel diode or BARRITT (barrier injection transit time) diode.

What is claimed is:
1. A microwave oscillation device comprising a cut-off waveguide having a cut-off characteristic with respect to a frequency used, a coaxial line section provided at one end of said cut-off waveguide, a resistor provided at one end of said coaxial line portion, an oscillation element provided at the other end of said coaxial line section, a dielectric resonance element resonating at said frequency used, disposed within said cut-off waveguide so as to be electromagnetically coupled to said oscillation element in terms of lumped constant, and an output waveguide connected to the other end of said cut-off waveguide so as to be electromagnetically coupled to said dielectric resonance element in terms of distributed constant.

2. A microwave oscillation device according to claim 1 wherein said coaxial line section includes a hollow outer conductor communicating with said cut-off waveguide and having one end provided with said resistor and the other end at which said oscillation element is disposed, and an inner conductor coaxially inserted into said hollow outer conductor and having one end connected to said oscillation element.

3. A microwave oscillation device according to claim 2 wherein said oscillation element comprises a Gunn diode.

4. A microwave oscillation device according to claim 2 wherein said other end of said outer conductor of said coaxial line section has an end face flush with an H plane of said cut-off waveguide.

5. A microwave oscillation device according to claim 2 wherein said other end of said outer conductor of said coaxial line section has an end face lower than an H plane of said cut-off waveguide.

6. A microwave oscillation device provided with said oscillation element according to claim 1 further comprising an adjusting screw provided at a prescribed portion of said cut-off waveguide between said other end of said cut-off waveguide and said dielectric resonance element in a manner screwed through a corresponding wall of said cut-off waveguide to said prescribed portion.

7. A microwave oscillation device provided with said oscillation element according to claim 6 further comprising a resonance frequency-adjusing rod inserted through a wall portion of said cut-off waveguide facing said dielectric resonance element.

8. A microwave oscillation device according to claim 7 wherein said oscillation element comprises a Gunn diode.

9. A microwave oscillation device comprising a waveguide short-circuited at one end and connected at the other end to a load, a metal-shielding plate for forming cut-off regions each having a cut-off characteristic with respect to a frequency used, disposed spaced by a prescribed distance from an E plane of said waveguide and substantially in parallel with said E plane, and in contact with H planes of said waveguide and substantially perpendicularly to said H plane and connected at one end to a short-circuiting end of said waveguide, a coaxial line section provided in one of said cut-off regions closely to said short-circuiting end of said waveguide, a resistor provided at one end of said coaxial line section, an oscillation element provided at the other end of said coaxial line section, and a dielectric resonance element provided within said one cut-off region so as to be electromagnetically coupled to said oscillation element in terms of lumped constant and to said load in terms of distributed constant.

10. A microwave oscillation device including the oscillation element according to claim 9 further comprising an adjusting screw provided within a portion of said one cut-off region spaced by a prescribed distance from said dielectric resonance element toward said load in a manner screwed through a corresponding waveguide wall to said portion.

11. A microwave oscillation device including the oscillation element according to claim 10 further comprising a resonance frequency-adjusting rod inserted through a wall portion of sid waveguide facing said dielectric resonance element.

12. A microwave oscillation device according to claim 11 wherein said oscillation element comprises a Gunn diode.

13. A microwave oscillation device according to claim 1 wherein said dielectric resonance element is formed of a titanate ceramics.

14. A microwave oscillation device according to claim 1 wherein a support member for supporting said dielectric resonance element is provided on the cut-off waveguide, said support member formed of one material selected from the group consisting of REXOLITE, quartz glass and fluorine compound.

* * * * *